(12) United States Patent
Zhou

(10) Patent No.: US 11,575,004 B2
(45) Date of Patent: Feb. 7, 2023

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 98 days.

(21) Appl. No.: 17/247,215

(22) Filed: Dec. 3, 2020

(65) Prior Publication Data
US 2021/0210600 A1 Jul. 8, 2021

(30) Foreign Application Priority Data
Jan. 8, 2020 (CN) .......................... 202010019475.0

(51) Int. Cl.
| | |
|---|---|
| *H01L 29/06* | (2006.01) |
| *H01L 29/423* | (2006.01) |
| *H01L 29/78* | (2006.01) |
| *H01L 29/775* | (2006.01) |
| *H01L 29/66* | (2006.01) |

(52) U.S. Cl.
CPC .... *H01L 29/0673* (2013.01); *H01L 29/42392* (2013.01); *H01L 29/66469* (2013.01); *H01L 29/66704* (2013.01); *H01L 29/775* (2013.01); *H01L 29/7825* (2013.01)

(58) Field of Classification Search
CPC ........... H01L 29/42392; H01L 29/0673; H01L 29/78696; H01L 29/0653
See application file for complete search history.

(56) References Cited

U.S. PATENT DOCUMENTS

| | | | |
|---|---|---|---|
| 9,837,414 B1* | 12/2017 | Balakrishnan | .... H01L 21/76895 |
| 2008/0017934 A1* | 1/2008 | Kim | ..................... H01L 29/0657 |
| | | | 257/E29.022 |
| 2010/0207208 A1* | 8/2010 | Bedell | ..................... B82Y 10/00 |
| | | | 257/E21.409 |

* cited by examiner

*Primary Examiner* — Changhyun Yi
(74) *Attorney, Agent, or Firm* — Anova Law Group, PLLC

(57) ABSTRACT

A semiconductor structure includes a substrate, including a first region, a second region, and a third region between the first region and the second region; a first fin structure including first nanowires disposed over the first region; a second fin structure including second nanowires disposed over the second region; and a first doped layer, disposed over the third region and in contact with each first nanowire and each second nanowire. The first and second nanowires are respectively arranged along a direction perpendicular to the surface of the substrate and both contain first doping ions. The first doped layer contains second doping ions with a type opposite to the type of the first doping ions. The semiconductor structure includes a source doped layer over the first region; a drain doped layer over the second region; and a first gate structure, disposed across the first fin structure and surrounding each first nanowire.

20 Claims, 4 Drawing Sheets

SEMICONDUCTOR STRUCTURE AND FORMATION METHOD THEREOF

CROSS-REFERENCE TO RELATED APPLICATIONS

This application claims the priority of Chinese Patent Application No. CN202010019475.0, filed on Jan. 8, 2020, the entire content of which is incorporated herein by reference.

FIELD OF THE DISCLOSURE

The present disclosure generally relates to the field of semiconductor manufacturing and, more particularly, relates to semiconductor structures and fabrication methods thereof.

BACKGROUND

With the continuous development of the semiconductor technology, the size of integrated circuits (ICs) becomes smaller and smaller, and existing fin field-effect transistor (Fin FET) reaches a limit for further increasing the operating current. Specifically, because only a region close to the top and sidewall surfaces of the fin structure serves as the channel region in existing Fin FET, the volume portion of the fin structure used as the channel region is small, limiting the increase of the operating current in the Fin FET. Therefore, Fin FET with a gate-all-around (GAA) structure has been provided to increase the volume of the fin structure used as the channel region. As such, the operating current of the Fin FET with the GAA structure is further improved.

In advanced semiconductor technology, Fin FETs with the GAA structure are more and more widely used to replace the conventional Fin FETs, and various derivative devices, such as lateral double-diffused metal-oxide-semiconductor (LDMOS) devices, based on Fin FETs with the GAA structure have been developed.

However, when Fin FETs with the GAA structure are used in LDMOS devices, the performance of the LDMOS devices may still need to be improved. The disclosed semiconductor structures and fabrication methods are directed to solve one or more problems set forth above and other problems in the art.

BRIEF SUMMARY OF THE DISCLOSURE

One aspect of the present disclosure provides a semiconductor structure. The semiconductor structure includes a substrate, including a first region, a second region, and a third region located there-between and in contact with each of the first region and the second region; a first fin structure, formed over the first region of the substrate, the first fin structure including a plurality of first nanowires that are parallel to a surface of the substrate and arranged in a direction perpendicular to the surface of the substrate; and a second fin structure, formed over the second region of the substrate, the second fin structure including a plurality of second nanowires that are parallel to the surface of the substrate and arranged in the direction perpendicular to the surface of the substrate. Each of the plurality of first nanowires contains first doping ions, and each of the plurality of second nanowires contains the first doping ions. The semiconductor structure also includes a first doped layer, disposed over the third region of the substrate and in contact with a sidewall surface of each first nanowire and each second nanowire. The first doped layer contains second doping ions, and a type of the second doping ions is opposite to a type of the first doping ions. The semiconductor structure further includes a source doped layer, disposed over the first region of the substrate and in contact with a sidewall surface of each first nanowire; a drain doped layer, disposed over the second region of the substrate and in contact with a sidewall surface of each second nanowire; and a first gate structure, disposed across the first fin structure and surrounding each of the plurality of first nanowires. The source doped layer and the first doped layer are located on two sides of the plurality of first nanowires, respectively. The drain doped layer and the first doped layer are located on two sides of the plurality of second nanowires, respectively.

Optionally, the second doping ions include N-type doping ions or P-type doping ions. The N-type doping ions include phosphorus ions, arsenic ions, or a combination thereof; and the P-type doping ions include boron ions, boron fluoride ions, indium ions, or a combination thereof.

Optionally, the concentration of the second doping ions is in a range of approximately 8E18 atom/cm$^3$ to 6E19 atom/cm$^3$.

Optionally, the first doped layer is made of a material including silicon phosphide (SiP) or silicon germanium (SiGe).

Optionally, the source doped layer and the drain doped layer contain third doping ions.

Further, the concentration of the second doping ions in the first doped layer is a first concentration; and the concentration of the third doping ions in the source doped layer and the drain doped layer is a second concentration. The first concentration is smaller than the second concentration.

Optionally, the semiconductor structure further includes a plurality of first sidewall spacers, located on a sidewall surface of the first gate structure between adjacent first nanowires and between the substrate and an adjacent first nanowire. The sidewall surface of each first sidewall spacer is vertically aligned with the sidewall surface of the plurality of first nanowires.

Optionally, the second fin structure further includes a plurality of second sacrificial layers located between adjacent second nanowires and between the substrate and an adjacent second nanowire; and a plurality of second sidewall spacers, located on a sidewall surface of the plurality of second sacrificial layers. The sidewall surface of each second sidewall spacer is vertically aligned with the sidewall surface of the plurality of second nanowires.

Optionally, the semiconductor structure further includes a second dummy gate structure, disposed over the second region of the substrate and across the second fin structure.

Optionally, the semiconductor structure further includes a dielectric layer, disposed on the substrate, wherein the first gate structure is located in the dielectric layer.

Another aspect of the present disclosure provides a method for forming a semiconductor structure. The method includes providing a substrate, including a first region, a second region, and a third region located there-between and in contact with each of the first region and the second region; forming a first initial fin structure over the first region of the substrate, the first fin structure including a plurality of first nanowires that are parallel to a surface of the substrate and arranged in a direction perpendicular to the surface of the substrate; and forming a second initial fin structure over the second region of the substrate, the second fin structure including a plurality of second nanowires that are parallel to the surface of the substrate and arranged in the direction perpendicular to the surface of the substrate. Each of the plurality of first nanowires contains first doping ions, and each of the plurality of second nanowires contains the first doping ions. The method also includes forming a first initial doped layer over the third region of the substrate and in contact with a sidewall surface of each first nanowire and each second nanowire. The first initial doped layer contains third doping ions, and the type of the third doping ions is opposite to the type of the first doping ions. The method also includes forming a source doped layer over the first region of the substrate and in contact with a sidewall surface of each first nanowire; and forming a drain doped layer over the second region of the substrate and in contact with a sidewall surface of each second nanowire. The source doped layer and the first doped layer are located on two sides of the plurality of first nanowires, respectively. The drain doped layer and the first doped layer are located on two sides of the plurality of second nanowires, respectively. The method further includes implanting fourth doping ions into the first initial doped layer to form a first doped layer. The type of the fourth doping ions is opposite to the type of the third doping ions, the first doped layer contains second doping ions, and the type of the second doping ions is opposite to the type of the first doping ions. The method includes forming a first gate structure over the first region of the substrate and across the first fin structure. The first gate structure surrounds each of the plurality of first nanowires.

Optionally, the second doping ions include N-type doping ions or P-type doping ions. The N-type doping ions include phosphorus ions, arsenic ions, or a combination thereof; and the P-type doping ions include boron ions, boron fluoride ions, indium ions, or a combination thereof. The concentration of the second doping ions is in a range of approximately $8E18$ atom/cm$^3$ to $6E19$ atom/cm$^3$.

Optionally, the first doped layer is made of a material including silicon phosphide (SiP) or silicon germanium (SiGe); and the source doped layer and the drain doped layer contain third doping ions.

Optionally, the concentration of the second doping ions in the first doped layer is a first concentration; and the concentration of the third doping ions in the source doped layer and the drain doped layer is a second concentration. The first concentration is smaller than the second concentration.

Optionally, implanting the fourth doping ions into the first initial doped layer includes an ion implantation process.

Optionally, the first initial fin structure further includes a plurality of first sacrificial layers, located between adjacent first nanowires and between the substrate and an adjacent first nanowire; and the second initial fin structure further includes a plurality of second sacrificial layers, located between adjacent second nanowires and between the substrate and an adjacent second nanowire.

Further, prior to forming the first initial doped layer, the method further includes forming a first dummy gate structure over the first region of the substrate and across the first initial fin structure; and forming a second dummy gate structure over the second region of the substrate and across the second initial fin structure.

Further, after forming the first dummy gate structure and the second dummy gate structure and prior to forming the first initial doped layer, the method further includes forming a plurality of first sidewall spacers on a sidewall surface of the plurality of first sacrificial layers between adjacent first nanowires and between the substrate and an adjacent first nanowire; and forming a plurality of second sidewall spacers on a sidewall surface of the plurality of second sacrificial layers between adjacent second nanowires and between the substrate and an adjacent second nanowire. The sidewall surface of each first sidewall spacer is vertically aligned with the sidewall surface of the plurality of first nanowires; and the sidewall surface of each second sidewall spacer is vertically aligned with the sidewall surface of the plurality of second nanowires.

Optionally, the method further includes forming the first gate structure includes forming a dielectric layer on the substrate, the first dummy gate structure located in the dielectric layer; removing the first dummy gate structure to form a first gate opening; removing the plurality of first sacrificial layers exposed by the first gate opening to form a first trench between adjacent first nanowires and between the substrate and a first nanowire; and forming a first gate structure in the first gate opening and the first trench. The first gate structure surrounds each of the plurality of first nanowire.

Further, the second dummy gate structure is located in the dielectric layer, the method includes removing the second dummy gate structure to form a second gate opening; removing the plurality of second sacrificial layers exposed by the second gate opening to form a second trench between adjacent second nanowires and between the substrate and a second nanowire; and forming a second gate structure in the second gate opening and the second trench. The second gate structure surrounds each of the plurality of second nanowires.

Compared to existing semiconductor structures and fabrication methods, the disclosed semiconductor structures and fabrication methods may demonstrate the following exemplary advantages.

According to the disclosed semiconductor structure, the first doped layer formed over the third region of the substrate contains second doping ions, and the first doped layer is in contact with the sidewall surface of each first nanowire and the sidewall surface of each second nanowire, respectively. The resistance of the first doped layer is large, such that the resistance of the semiconductor structure is also large in the on state. As such, the semiconductor structure may be unlikely broken down, which is conducive to the performance of the semiconductor structure.

Further, according to the disclosed fabrication method, a first initial doped layer containing third doping ions is formed over the third region of the substrate, and then fourth doping ions are implanted into the first initial doped layer to form a first doped layer. The type of the fourth doping ions is opposite to the type of the third doping ions. As a result, the first doped layer contains second doping ions, and the type of the second doping ions is opposite to the typed of the first doping ions. Therefore, as compared to the ion concentration in the first initial doped layer, the ion concentration in the first doped layer is reduced. Thus, without increasing the size of the first doped layer, the resistance of the first doped layer increases, thereby increasing the breakdown voltage of the semiconductor structure and improving the performance of the semiconductor structure. At the same time, the disclosed method is able to simplify the fabrication process of the semiconductor structure, and can be integrated with the existing nanowire transistor fabrication process without any need for substantially changing the existing process. Therefore, the stability of the fabrication process may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

The present disclosure provides a semiconductor structure and a fabrication method of the semiconductor structure. For example, the semiconductor structure may be an LDMOS device that includes a Fin FET having a gate-all-around (GAA) structure. According to the disclosed semiconductor structure and fabrication method, a first initial doped layer containing third doping ions is formed over the third region of the substrate, and then by implanting fourth doping ions with a type opposite to the type of the third doping ions into the first initial doped layer, a first doped layer is formed from the first initial doped layer. By reversely-doping the first initial doped layer, the ion concentration in the formed first doped layer is reduced, and the first doped layer can be used without increasing the dimension of the doped layer. The resistance of the first doped layer is increased, which increases the breakdown voltage of the semiconductor structure and improves the performance of the semiconductor structure.

To make the aforementioned objectives, features, and beneficial effects of the present disclosure more comprehensible, specific embodiments of the present disclosure are described in detail with reference to the accompanying drawings. It should be noted that the term "surface" in this specification is used to describe the relative positional relationship in space, and is not limited to direct contact.

Figure 6:
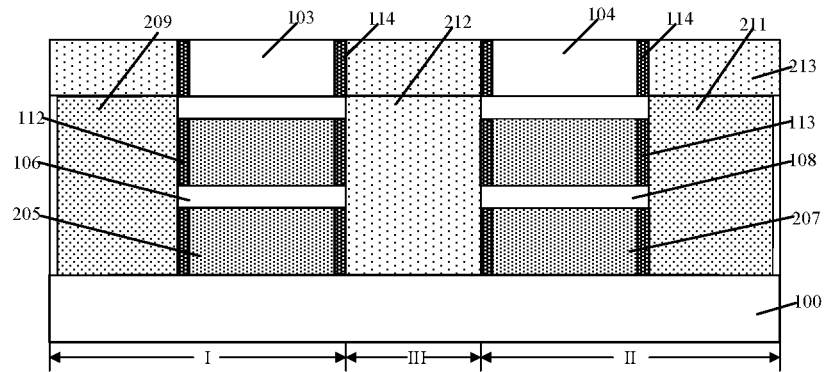
Figure 7:
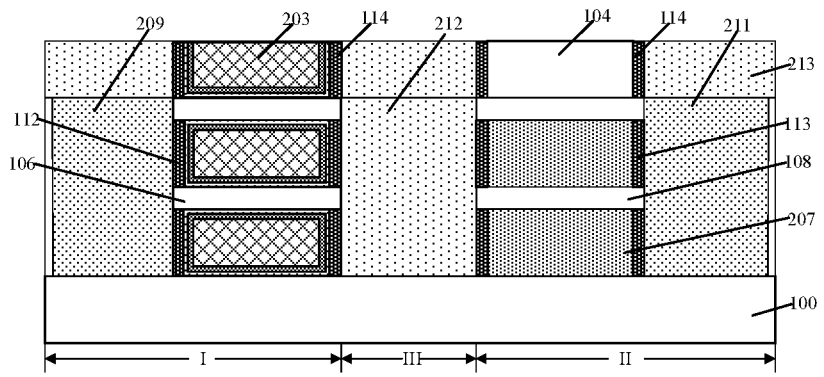
Figure 8:
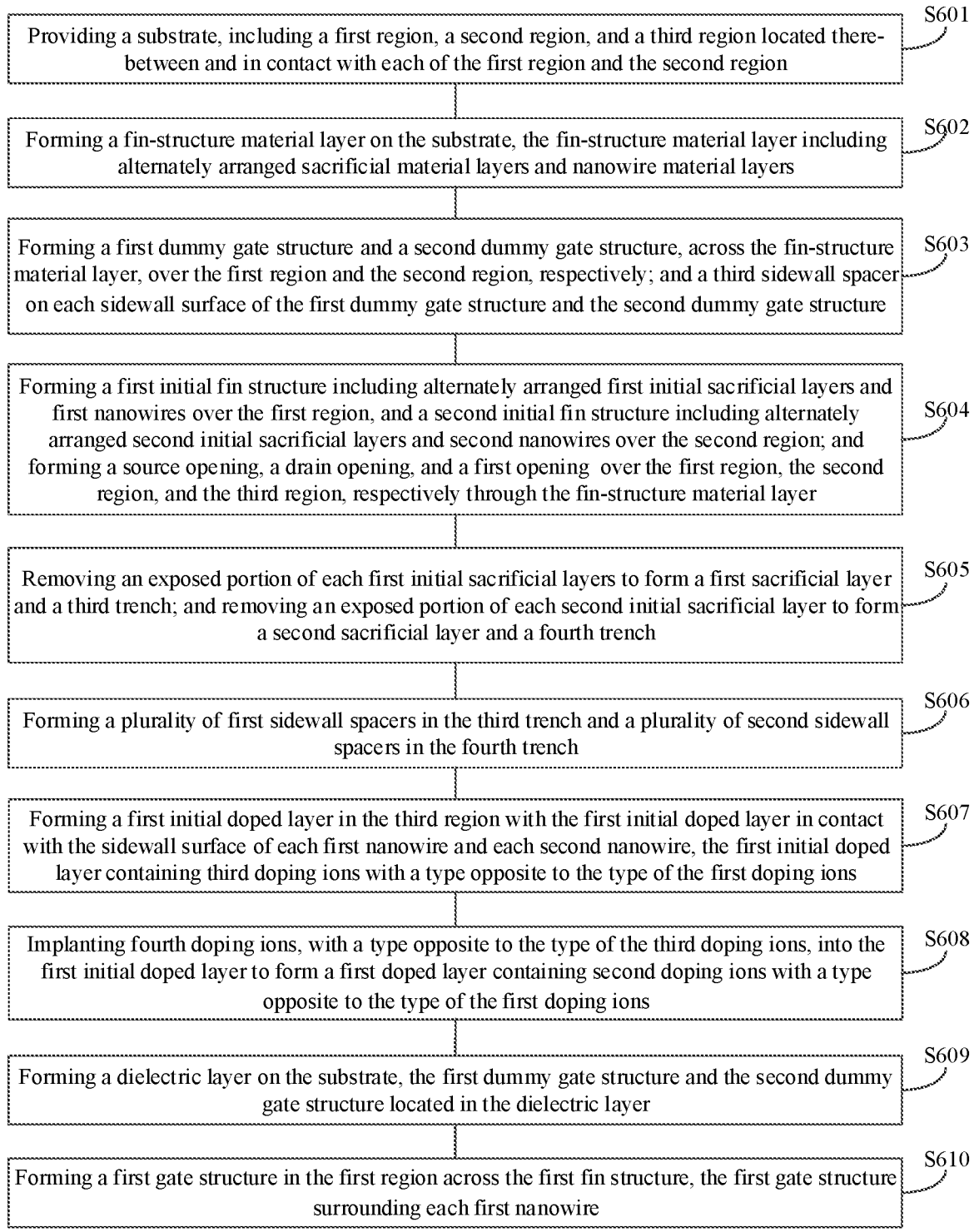
FIG. 8 illustrates a flowchart of an exemplary method for fabricating a semiconductor structure consistent with some embodiments of the present disclosure.

FIG. 8 illustrates a flowchart of an exemplary method for fabricating a semiconductor structure consistent with some embodiments of the present disclosure, and FIGS. 1-7 illustrate schematic views of structures at certain stages for forming an exemplary semiconductor structure.

Figure 1:
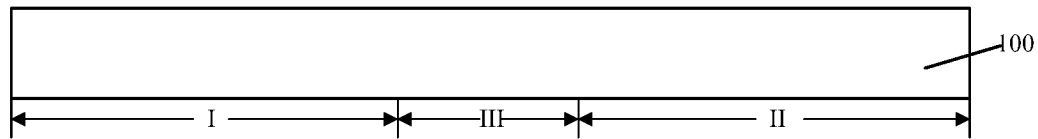
FIGS. 1-7 illustrate schematic views of structures at certain stages for forming an exemplary semiconductor structure according to some embodiments of the present disclosure.

Referring to FIG. 8, a substrate including a first region, a second region, and a third region may be provided. The third region is located between the first region and the second region and third region is in contact with each of the first region and the second region (S601). FIG. 1 illustrates a schematic cross-sectional view of a corresponding semiconductor structure consistent with various embodiments of the present disclosure.

Referring to FIG. 1, a substrate 100 may be provided. The substrate 100 may include a first region I, a second region II, and a third region III. The third region III may be located between the first region I and the second region II, and may be in contact with each of the first region I and the second region II.

In some embodiments, the substrate 100 may be made of silicon (Si). In other embodiments, the substrate may be made of silicon germanium (SiGe), germanium (Ge), silicon on insulator (SOI), germanium on insulator (GOI), or any other appropriate semiconductor material.

In some embodiments, the substrate 100 may contain first doping ions. The first doping ions may be N-type doping ions or P-type doping ions. The P-type doping ions may include boron ions, boron fluoride ions, indium ions, or a combination thereof. The N-type doping ions may include phosphorus ions, arsenic ions, or a combination thereof. In some embodiments, the first doping ions may include P-type doping ions, and the P-type doping ions may include boron ions. In other embodiments, the first doping ions may include N-type doping ions, and the N-type doping ions may include phosphorus ions or arsenic ions.

In subsequent fabrication processes, a first initial fin structure may be formed over the first region I of the substrate 100. The first initial fin structure may include a plurality of first nanowires parallel to the surface of the substrate 100. The plurality of first nanowires may be arranged above each other along a direction perpendicular to the surface of the substrate 100. The plurality of first nanowires may contain the first doping ions. A second initial fin structure may be formed over the second region II of the substrate 100. The second initial fin structure may include a plurality of second nanowires parallel to the surface of the substrate 100. The plurality of second nanowires may be arranged above each other along a direction perpendicular to the surface of the substrate 100. The plurality of second nanowires may contain the first doping ions.

In one embodiment, the first initial fin structure may further include a first sacrificial layer disposed between adjacent first nanowires and between the substrate 100 and the first nanowire close to the substrate 100; and the second initial fin structure may further include a second sacrificial layer disposed between adjacent second nanowires and between the substrate 100 and the second nanowire close to the substrate 100.

The first initial fin structure and the second initial fin structure may be simultaneously formed as described in detail below.

Figure 2:
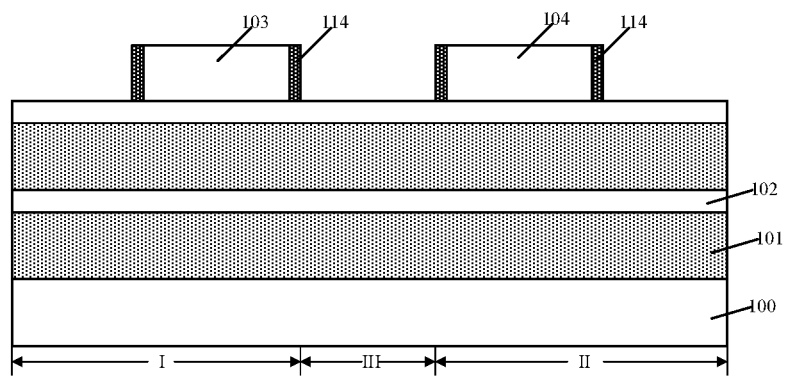

Referring to FIG. 8, a fin-structure material layer may be formed on the substrate, and the fin-structure material layer may include alternately arranged sacrificial material layers and nanowire material layers (S602). FIG. 2 illustrates a schematic cross-sectional view of a corresponding semiconductor structure consistent with various embodiments of the present disclosure.

Referring to FIG. 2, a fin-structure material layer may be formed on the substrate 100. The fin-structure material layer may include a plurality of sacrificial material layers 101 and a plurality of nanowire material layers 102. The plurality of sacrificial material layers 101 and the plurality of nanowire material layers 102 may be alternately arranged such that, for example, each nanowire material layer 102 is always disposed on a sacrificial material layer 101.

The process of forming the fin-structure material layer may include the following exemplary steps. An initial fin-structure material layer may be formed on the substrate 100. The initial fin-structure material layer may include a plurality of initial sacrificial material layers (not shown) and a plurality of initial nanowire material layers (not shown). The plurality of initial sacrificial material layers and the plurality of initial nanowire layers may be alternately arranged such that each initial nanowire material layer is always disposed on an initial sacrificial material layer. A patterned mask layer may then be formed on the initial fin-structure material layer. Further, the initial fin-structure material layer may be etched using the patterned mask layer as an etch mask to expose the surface of the substrate 100. As such, the fin-structure material layer may be formed.

The plurality of nanowire material layers 102 may provide a material layer for the formation of the first and second nanowires, and the plurality of sacrificial material layers 101 may provide a material layer for the formation of the first and second sacrificial layers. The plurality of nanowire material layers 102 may be made of single-crystalline silicon (Si) and/or single-crystalline silicon germanium (SiGe). The plurality of sacrificial material layers 101 may be made of single-crystalline silicon (Si) and/or single-crystalline silicon germanium (SiGe). The plurality of nanowire material layers 102 and the plurality of sacrificial material layers 101 may be made of different materials.

In one embodiment, the plurality of sacrificial material layers 101 may be made of silicon germanium (SiGe), and the plurality of nanowire material layers 102 may be made of single-crystalline silicon germanium (SiGe). Because the etching selection ratio of single-crystalline silicon to silicon germanium is large, when the first sacrificial layers and the second sacrificial layers are subsequently removed, the first nanowires and the second nanowires may not be damaged during the etching process.

After forming the fin-structure material layer, an isolation layer (not shown) may be formed on the substrate 100. The top surface of the isolation layer may be lower than or leveled with the bottom surface of the fin-structure material layer. The isolation layer may be made of a material including at least one of silicon oxide ($SiO_x$), silicon nitride ($SiN_x$), and silicon oxynitride (SiON). In one embodiment, the isolation layer may be made of silicon oxide ($SiO_x$).

Further, referring to FIG. 8, after forming the isolation layer, a first dummy gate structure may be formed over the first region of the substrate and across the fin-structure material layer; a second dummy gate structure may be formed over the second region of the substrate and across the fin-structure material layer; and a third sidewall spacer may be formed on each sidewall surface of the first dummy gate structure and the second dummy gate structure (S603). The semiconductor structure schematically shown in FIG. 2 also includes a first dummy gate structure, a second dummy gate structure, and a third sidewall spacer on each of the sidewall surfaces of the first and second dummy gate structure.

After forming the isolation layer, referring back to FIG. 2, a first dummy gate structure 103 may be formed over the first region I of the substrate 100 and across the fin-structure material layer; and a second dummy gate structure 104 may be formed over the second region II of the substrate 100 and across the fin-structure material layer. In addition, a third sidewall spacer 114 may be formed on each sidewall surface of the first dummy gate structure 103 and the second dummy gate structure 104.

The first dummy gate structure 103 may include a first dummy gate dielectric layer (not shown) and a first dummy gate electrode layer (not shown) formed on the first dummy gate dielectric layer. The second dummy gate structure 104 may include a second dummy gate dielectric layer (not shown) and a second dummy gate electrode layer (not shown) formed on the second dummy gate dielectric layer.

In one embodiment, the first dummy gate structure 103 and the second dummy gate structure 104 may be formed simultaneously. For example, the process of forming the first dummy gate structure 103 and the second dummy gate structure 104 may include the following exemplary steps. A dummy gate dielectric material layer (not shown) may be formed on the surface of the substrate 100, and a dummy gate material layer (not shown) may be formed on the dummy gate dielectric material layer. Further, a patterned mask layer (not shown) may be formed on the dummy gate material layer. The dummy gate material layer and the dummy gate dielectric material layer may be etched using the patterned mask layer as an etch mask until the surface of the isolation layer is exposed. As such, a first dummy gate structure 103 may be formed over the first region I of the substrate 100, and a second dummy gate structure 104 may be formed over the second region II of the substrate 100.

The dummy gate dielectric layer may be made of a material including silicon oxide ($SiO_x$), a low-K (a relative dielectric constant smaller than 3.9) dielectric material, or a high-K (a relative dielectric constant larger than 3.9) dielectric material. The dummy gate material layer may be made of a material including polycrystalline silicon or a metal. The process of forming the dummy gate dielectric material layer may include an atomic layer deposition (ALD) process or a chemical vapor deposition (CVD) process. The process of forming the dummy gate material layer may include a physical vapor deposition (PVD) process or an ALD process. The process of etching the dummy gate material layer and the dummy gate dielectric material layer may include a dry etching process, a wet etching process, or a process combining dry etching and wet etching.

In one embodiment, the dummy gate dielectric layer may be made of a material including silicon oxide, and the dummy gate material layer may be made of a material including polycrystalline silicon. The process of forming the dummy gate dielectric material layer may include an ALD process, and the ALD process may be able to form a dummy gate dielectric material layer with a small thickness and a dense structure. The process of forming the dummy gate material layer may include a PVD process, and the PVD process may be able to form a dummy gate material layer with a large thickness and a dense structure. The process of etching the dummy gate material layer and the dummy gate dielectric material layer may include a dry etching process, and the dry etching process may be able to form a dummy gate structure with desired morphology.

In one embodiment, the process of forming the third sidewall spacer may include the following exemplary steps. A sidewall material layer (not shown) may be formed on the substrate 100 and on the top and sidewall surfaces of the first and second dummy gate structures. The sidewall material layer may then be etched back to expose the surface of the isolation layer. As such, a third sidewall spacer may be formed on each sidewall surface of the first dummy gate structure 103 and the second dummy gate structure 104.

The third sidewall spacer may be made of a material including silicon oxide ($SiO_x$), silicon nitride ($SiN_x$), silicon oxynitride (SiON), or silicon carbonitride (SiCN). The process of forming the sidewall material layer may include a CVD process or an ALD process.

In one embodiment, the third sidewall spacer may be made of a material including silicon nitride ($SiN_x$). The third sidewall spacer and the isolation layer may be made of different materials, such that the etching process for forming the third sidewall space may be stopped when exposing the isolation layer. In one embodiment, the process of forming the sidewall material layer may include a CVD process.

Figure 3:
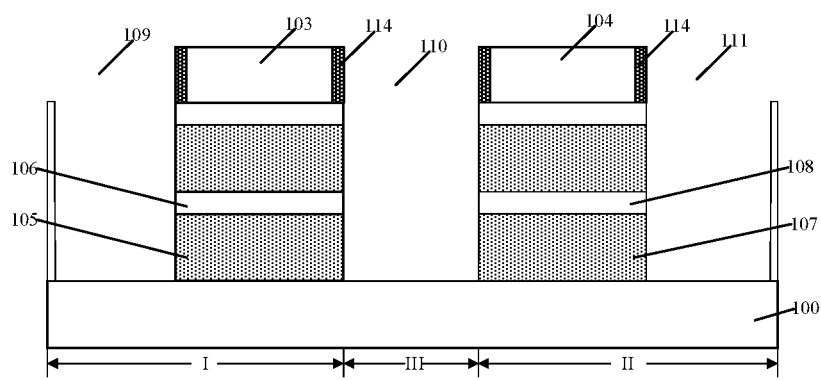

Further, returning to FIG. 8, a first initial fin structure may be formed over the first region of the substrate, the first initial fin structure including a plurality of first initial sacrificial layers and a plurality of first nanowires with each first nanowire disposed on a first initial sacrificial layer; a second initial fin structure may be formed over the second region of the substrate, the second initial fin structure including a plurality of second initial sacrificial layers and a plurality of second nanowires with each second nanowire disposed on a second initial sacrificial layer; a source opening may be formed in the fin-structure material layer disposed over the first region; a drain opening may be formed in the fin-structure material layer disposed over the second region; and a first opening may be formed in the fin-structure material layer disposed over the third region (S604). FIG. 3 illustrates a schematic cross-sectional view of a semiconductor structure consistent with various embodiments of the present disclosure.

Referring to FIG. 3, a first initial fin structure may be formed over the first region I of the substrate 100. The first initial fin structure may include a plurality of first initial sacrificial layers 105 and a plurality of first nanowires 106. The plurality of first initial sacrificial layers 105 and the plurality of first nanowires 106 may be alternately arranged with a first nanowire 106 disposed on a first initial sacrificial layer 105. A second initial fin structure may be formed over the second region II of the substrate 100. The second initial fin structure may include a plurality of second initial sacrificial layers 107 and a plurality of second nanowires 108. The plurality of second initial sacrificial layers 107 and the plurality of second nanowires 108 may be alternately arranged with a second nanowire 108 disposed on a second initial sacrificial layer 107. In one embodiment, the first initial fin structure and the second initial fin structure may be formed simultaneously.

In one embodiment, when forming the first initial fin structure and the second initial fin structure, a source opening 109 may be formed in the fin-structure material layer disposed over the first region I of the substrate 100 to expose the sidewall surface of the first initial fin structure; a drain opening 111 may be formed in the fin-structure material layer disposed over the second region II of the substrate 100 to expose the sidewall surface of the second initial fin structure; and a first opening 110 may be formed in the fin-structure material layer disposed over the third region III of the substrate 100 to expose the sidewall surfaces of the first initial fin structure and the second initial fin structure.

The first nanowire 106 may contain first doping ions, and the second nanowire 108 may also include first doping ions. The first doping ions may include N-type doping ions or P-type doping ions. The N-type doping ions may include phosphorus ions, arsenic ions, or a combination thereof. The P-type doping ions may include boron ions, boron fluoride ions, indium ions, or a combination thereof.

In some embodiments, the first doping ions may include P-type doping ions, and the P-type doping ions may include boron ions. In one embodiment, the concentration of the first doping ions may be in a range of approximately 2E17 atoms/cm$^3$ to 5E18 atoms/cm$^3$. In other embodiments, the first doping ions may include N-type doping ions, and the N-type doping ions may include phosphorus ions or arsenic ions.

In a subsequent process, a first doped layer may be formed in the first opening 110. The first doped layer and the second nanowire 108 may together serve as a drift region of the semiconductor structure. When the length of the drift region is longer, the resistance of the drift region becomes larger. As such, the voltage division effect of the drift region may be desired, and the semiconductor structure may be able to have desired breakdown resistance. The first nanowire 106 may serve as the body region of the semiconductor structure.

The process of forming the first initial fin structure and the second initial fin structure may include the following exemplary steps. The fin-structure material layer may be etched using the first dummy gate structure 103 and the second dummy gate structure 104 as an etch mask until the surface of the substrate 200 is exposed. As such, the first initial fin structure and the source opening 109 may be formed over the first region I of the substrate 100, the second initial fin structure and the drain opening 111 may be formed over the second region II of the substrate 100, and the first opening 110 may be formed over the third region III of the substrate 100. In one embodiment, the process of etching the fin structure material layer may include a dry etching process.

Figure 4:
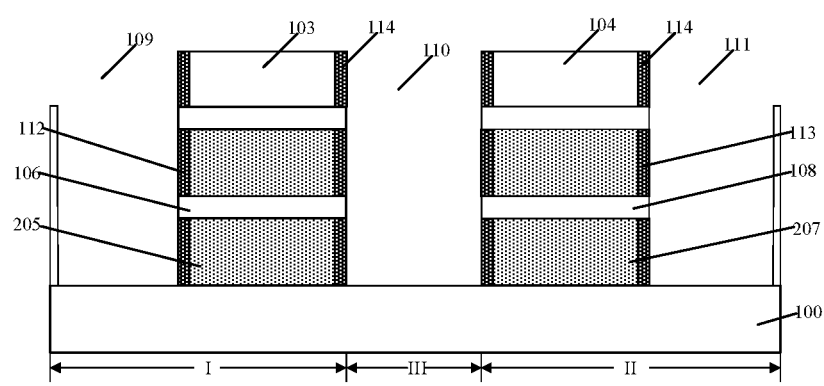

Further, returning to FIG. 8, a portion of each first initial sacrificial layer exposed by the source opening and the first opening may be removed to form a first sacrificial layer and a third trench, the third trench located on the sidewall surface of the first sacrificial layer between adjacent first nanowires and between the substrate and the adjacent first nanowire; and a portion of each second initial sacrificial layer exposed by the drain opening and the first opening may be removed to form a second sacrificial layer and a fourth trench, the fourth trench located on the sidewall surface of the second sacrificial layer between adjacent second nanowires and between the substrate and the adjacent second nanowire (S605). FIG. 4 illustrates a schematic cross-sectional view of a semiconductor structure consistent with various embodiments of the present disclosure.

Referring to FIG. 4, a portion of each first initial sacrificial layer 105 (referring to FIG. 3) exposed by the source opening 109 and the first opening 110 may be removed. The remaining portion of the first initial sacrificial layer 105 may form a first sacrificial layer 205. At the same time, a third trench (not shown) may be formed on the sidewall surface of the first sacrificial layer 205 between adjacent first nanowires 106 and between the substrate 100 and the adjacent first nanowire 106. That is, the space corresponding to the removed portion of the first initial sacrificial layer 105 may become the third trench. A portion of each second initial sacrificial layer 107 (referring to FIG. 3) exposed by the drain opening 111 and the first opening 110 may be removed. The remaining portion of the second initial sacrificial layer 107 may form a second sacrificial layer 207. At the same time, a fourth trench (not shown) may be formed on the sidewall surface of the second sacrificial layer 207 between adjacent second nanowires 108 and between the substrate 100 and the adjacent second nanowire 108. That is, the space corresponding to the removed portion of the second initial sacrificial layer 107 may become the fourth trench.

In a subsequent process, the third trench may be used to form a plurality of first sidewall spacers, and the fourth trench may be used to form a plurality of second sidewall spacers. The plurality of first sidewall spacers and the plurality of second sidewall spacers may be formed simultaneously.

The process of removing the portion of the first initial sacrificial layer 105 and the portion of the second initial sacrificial layer 107 may include a dry etching process, a wet etching process, or a process combining dry etching and wet etching. In one embodiment, the process of removing the portion of the first initial sacrificial layer 105 and the portion of the second initial sacrificial layer 107 may include a wet etching process. The wet etching process may have an etching rate on the first initial sacrificial layer 105 and the second initial sacrificial layer 107 higher than an etching rate on the first nanowires 106 and the second nanowires 108, such that the damage to the first nanowires 106 and the second nanowires 108 may be limited during the wet etching process. In some embodiments, the fourth trench may not be formed.

Further, returning to FIG. 8, a plurality of first sidewall spacers may be formed over the third trench of the substrate and a plurality of second sidewall spacers may be formed in the fourth trench (S606). The semiconductor structure illustrated in FIG. 4 is an exemplary structure including a plurality of first sidewall spacers and a plurality of second sidewall spacers.

Referring to FIG. 4, a plurality of first sidewall spacers 112 may be formed in the third trench, and the sidewall surface of each first sidewall spacer 112 may be vertically aligned with the sidewall surface of the first nanowires 106. In addition, a plurality of second sidewall spacer 113 may be formed in the fourth trench, and the sidewall surface of each second sidewall spacer 113 may be vertically aligned with the sidewall surface of the second nanowires 108.

The plurality of first sidewall spacers 112 may be used to isolate a source doped layer that is subsequently formed over the first region I of the substrate 100 from the first gate structure, thereby preventing the source doped layer from being directly in contact with the first gate structure and thus generating large parasitic capacitance. The plurality of first sidewall spacers 112 may also be used to isolate a first doped layer that is subsequently formed over the third region III of the substrate 100 from the first gate structure, thereby preventing the first doped layer from being directly in contact with the first gate structure and thus generating large parasitic capacitance.

The plurality of second sidewall spacers 113 may be used to isolate a drain doped layer that is subsequently formed over the second region II of the substrate from the second gate structure, thereby preventing the drain doped layer from being directly in contact with the second gate structure and thus generating large parasitic capacitance. The plurality of second sidewall spacers 113 may also be used to isolate the first doped layer formed over the third region III of the substrate 100 from the second gate structure, thereby preventing the first doped layer from being directly in contact with the second gate structure and thus generating large parasitic capacitance.

In one embodiment, the plurality of second sidewall spacers 113 and the plurality of first sidewall spacers 112 may be formed simultaneously. Simultaneously forming the plurality of second sidewall spacers 113 and the plurality of first sidewall spacers 112 may be able to increase the integration level of the process, thereby simplifying the fabrication flow, and making the process more widely applicable.

The process of forming the plurality of first sidewall spacers 112 and the plurality of second sidewall spacers 113 may include the following exemplary steps. A sidewall-spacer material layer (not shown) may be formed in the third trench and the fourth trench, and on the inner sidewall surface of the source opening 109, the inner sidewall surface of the drain opening 111, and the inner sidewall surface of the first opening 110. The sidewall-spacer material layer may be etched back to form an initial sidewall spacer (not shown) in the third trench and the fourth trench and also on the sidewall surface of each first nanowire 106 and each second nanowire 108. Further, the initial sidewall spacer may be etched to expose the sidewall surface of each first nanowire 106 and the sidewall surface of each second nanowire 108. As such, a plurality of first sidewall spacers 112 may be formed in the third trench, and a plurality of second sidewall spacers 113 may be formed in the fourth trench.

The plurality of first sidewall spacers 112 and the plurality of second sidewall spacers 113 may be made of a material including silicon oxide ($SiO_x$), silicon nitride ($SiN_x$), silicon oxynitride (SiON), silicon oxycarbide (SiOC), silicon carbon-oxynitride (SiCON), or a combination thereof. The process of forming the sidewall-spacer material layer may include a CVD process or an ALD process. The process of etching the initial sidewall spacer may include a dry etching process, a wet etching process, or a process combining dry etching and wet etching.

In some embodiments, the plurality of first sidewall spacers 112 and the plurality of second sidewall spacers 113 may be made of silicon nitride ($SiN_x$); the process of forming the sidewall-spacer material layer may include a CVD process; the process of etching the initial sidewall spacer may include an isotropic dry etching process. The isotropic dry etching process may be able to etch the initial sidewall spacer along a direction perpendicular to the sidewall surface of the initial sidewall spacer so as to form the plurality of first sidewall spacers 112 with a uniform thickness in the third trench and the plurality of second sidewall spacers 113 with a uniform thickness in the fourth trench. In other embodiments, the plurality of second sidewall spacers may not be formed.

Figure 5:
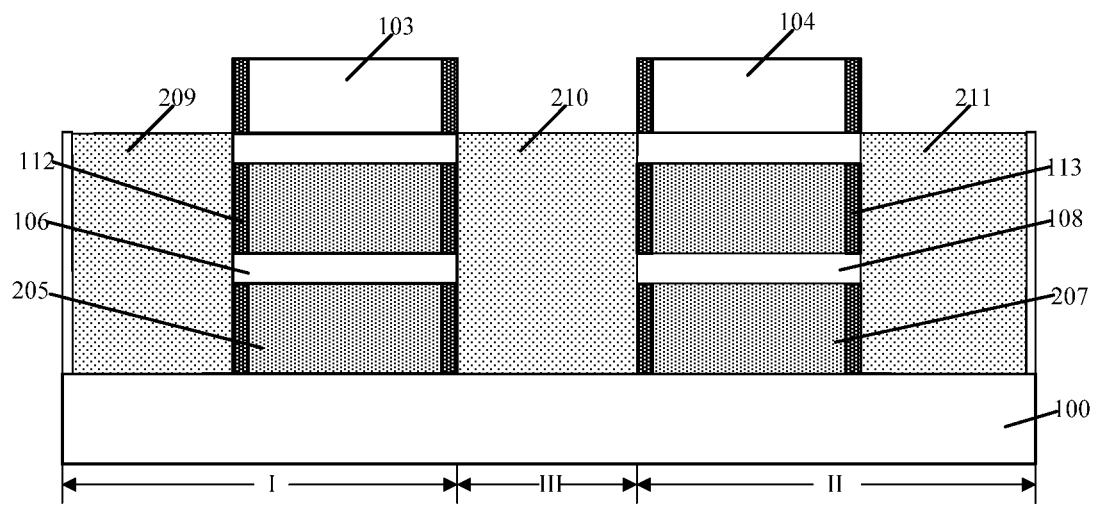

Further, returning to FIG. 8, a first initial doped layer may be formed over the third region of the substrate with the first initial doped layer in contact with the sidewall surface of each first nanowire and each second nanowire, the first initial doped layer may contain third doping ions, and the type of the third doping ions may be opposite to the type of the first doping ions (S607). FIG. 5 illustrates a schematic cross-sectional view of a semiconductor structure consistent with various embodiments of the present disclosure.

Referring to FIG. 5, a first initial doped layer 210 may be formed over the third region III of the substrate 100. The first initial doped layer 210 may be in contacted with the sidewall surface of each first nanowire 106 and the sidewall surface of each second nanowire 108. The first initial doped layer 210 may contain third doping ions, and the type of the third doping ions may be opposite to the type of the first doping ions.

When forming the first initial doped layer 210 over the third region III of the substrate 100, a source doped layer 209 may be simultaneously formed over the first region I of the substrate 100. The source doped layer 209 may be in contact with the sidewall surface of each first nanowire 106, and the source doped layer 209 and the first initial doped layer 210 may be respectively formed on the two opposite sides of the plurality of first nanowires 106. In addition, a drain doped layer 211 may also be simultaneously formed over the second region II of the substrate 100. The drain doped layer 211 may be in contact with the sidewall surface of each second nanowire 108, and the drain doped layer 211 and the first initial doped layer 210 may be respectively formed on the two opposite sides of the plurality of second nanowires 108.

In one embodiment, the first initial doped layer 210, the source doped layer 209, and the drain doped layer 211 may be simultaneously formed. As such, the fabrication process of the semiconductor structure may be simplified, and the fabrication process can be integrated with the existing nanowire transistor fabrication process without any need for substantially changing the existing process. Therefore, the stability of the fabrication process may be improved.

The first initial doped layer 210 may be made of a material including silicon phosphide (SiP) or silicon germanium (SiGe). The source doped layer 209 may be made of a material including silicon phosphide (SiP) or silicon germanium (SiGe), and the source doped layer 209 may include the third doping ions. The drain doped layer 211 may be made of a material including silicon phosphide (SiP) or silicon germanium (SiGe), and the drain doped layer 211 may include the third doping ions.

The third doping ions may be N-type doping ions or P-type doping ions. The N-type doping ions may include phosphorus ions, arsenic ions, or a combination thereof. The P-type doping ions may include boron ions, boron fluoride ions, indium ions, or a combination thereof. The type of the third doping ions may be opposite to the type of the first doping ions.

In one embodiment, the first initial doped layer 210, the source doped layer 209, and the drain doped layer 211 may be made of a material including silicon phosphide (SiP); the third doping ions may include N-type doping ions; and the N-type doping ions may include phosphorus ions.

In one embodiment, the concentration of the third doping ions in the first initial doped layer 210, the source doped layer 209, and the drain doped layer 211 may be a second concentration, and the second concentration may be in a range of approximately 1E20 atom/cm$^3$ to 4E21 atom/cm$^3$.

In some embodiments, the process of forming the first initial doped layer 210, the source doped layer 209, and the drain doped layer 211 may include an epitaxial growth process. The process parameters used in the epitaxial growth process may include a mixed processing gas including dichlorohycrosilane, hydrogen chloride, phosphine, and hydrogen; a flow rate of dichlorohycrosilane in a range of approximately 30 sccm to 150 sccm; a flow rate of hydrogen chloride in a range of approximately 10 sccm to 200 sccm; a flow rate of hydrogen in a range of approximately 200 sccm to 2000 sccm, a flow rate of phosphine in a range of approximately 100 sccm to 2000 sccm, a processing pressure in a range of approximately 150 Torr to 650 Torr, and a processing temperature in a range of approximately 500° C. to 850° C.

In other embodiments, the first initial doped layer, the source doped layer, and the drain doped layer may be made of a material including SiGe; the third doping ions may include P-type doping ions; and the P-type doping ions may include boron ions, boron fluoride ions, indium ions, or a combination thereof.

Further, returning to FIG. 8, the first initial doped layer may be doped with fourth doping ions to form a first doped layer, the type of the fourth doping ions opposite to the type of the third doping ions, the first doped layer containing second doping ions, and the type of the second doping ions opposite to the type of the first doping ions (S608). FIG. 6 illustrates a schematic cross-sectional view of a semiconductor structure consistent with various embodiments of the present disclosure.

Referring to FIG. 6, the first initial doped layer 210 may be doped with fourth doping ions to form a first doped layer 212. The type of the fourth doping ions may be opposite to the type of the third doping ions. The first doped layer 212 may contain second doping ions, and the type of the second doping ions may be opposite to the type of first doping ions.

The fourth doping ions may include N-type doping ions or P-type doping ions. The N-type doping ions may include phosphorus ions, arsenic ions, or a combination thereof. The P-type doping ions may include boron ions, boron fluoride ions, indium ions, or a combination thereof. The type of the fourth doping ions may be opposite to the type of the third doping ions.

The process of doping the fourth doping ions into the first initial doped layer 210 may include an ion implantation process. When the fourth doping ions are P-type doping ions, the processing parameters adopted in the ion implantation process may include doping ions including boron ions, boron fluoride ions, indium ions, or a combination thereof; a doping concentration in a range of approximately 6E19 atom/cm$^3$ to 8.5E21 atom/cm$^3$; and an implantation energy in a range of 5 keV to 80 keV. In one embodiment, the fourth doping may include P-type doping ions, and the P-type doping ions may include boron ions.

The doping concentration of the fourth doping ions may be smaller than the doping concentration of the third doping ions, so that the fourth doping ions may be able to partially neutralize the third doping ions. As such, the concentration of the second doping ions in the formed first doped layer may be smaller than the concentration of the third doping ions in the first initial doped layer. Therefore, the ion concentration of the first doped layer may be lower than that of the first initial doped layer, and the type of the second doping ions may not be changed, thereby not affecting the operation of the semiconductor structure.

The second doping ions may include N-type doping ions or P-type doping ions. The N-type doping ions may include phosphorus ions, arsenic ions, or a combination thereof The P-type doping ions may include boron ions, boron fluoride ions, indium ions, or a combination thereof. The type of the second doping ions may be the same as the type of the third doping ions, and opposite to the type of the first doping ions.

In one embodiment, the second doping ions may include N-type doping ions, and the N-type doping ions may include phosphorus ions. The first concentration may be smaller than the second concentration of the third doping ions. The first concentration may be in a range of approximately 8E18 atom/cm$^3$ to 6E19 atom/cm$^3$.

By doping the fourth doping ions into the first initial doped layer 210, and having the type of the fourth doping ions opposite to that of the third doping ions in the first initial doped layer 210, the introduced fourth doping ions may be able to partially neutralize the third doping ions, such that the formed first doped layer 212 may contain second doping ions. The first concentration of the second doping ions implanted into the formed first doped layer 212 may be smaller than the second concentration of the third doping ions in the first initial doped layer 210, such that compared to the first initial doped layer, the first doped layer may have a reduced ion concentration. The first doped layer 212 together with the plurality of second nanowires 108 may serve as the drift region of the semiconductor structure. As such, the first doped layer 212 may be able to increase the resistance of the first doped layer without increasing the size of the first doped layer 212, thereby increasing the breakdown voltage of the semiconductor structure and improving the performance of the semiconductor structure.

Further, returning to FIG. 8, after forming the first doped layer, a dielectric layer may be formed on the substrate, and the first dummy gate structure and the second dummy gate structure may be located in the dielectric layer (S609). The semiconductor structure illustrated in FIG. 6 is an exemplary structure including a dielectric layer.

Referring to FIG. 6, after forming the first doped layer 212, a dielectric layer 213 may be formed on the substrate 100. After forming the dielectric layer 213, the first dummy gate structure 103 and the second dummy gate structure 104 may be located in the dielectric layer 213.

The process of forming the dielectric layer 213 may include the following exemplary steps. A dielectric material layer (not shown) may be formed on the substrate 100. The dielectric material layer may be planarized until exposing the top surfaces of the first dummy gate structure 103 and the second dummy gate structure 104. As such, the dielectric layer 213 may be formed.

The process of forming the dielectric material layer may include a CVD process or an ALD process. The dielectric layer 213 may be made of a material including silicon oxide (SiO$_x$), silicon nitride (SiN$_x$), silicon oxynitride (SiON), silicon oxycarbide (SiOC), silicon carbon-oxynitride (Si-CON), or a combination thereof.

In one embodiment, the process of forming the dielectric material layer may include a CVD process, and the CVD process may be able to quickly form a thick and dense dielectric material layer. The dielectric layer 213 may be made of material including silicon oxide (SiO$_x$).

Further, returning to FIG. 8, a first gate structure may be formed over the first region of the substrate and across the first fin structure, and the first gate structure may surround the each of the plurality of first nanowires (S610). FIG. 7 illustrates a schematic cross-sectional view of a semiconductor structure consistent with various embodiments of the present disclosure.

Referring to FIG. 7, a first gate structure 203 may be formed over the first region I of the substrate 100 and across the first fin structure. The first gate structure 203 may surround each of the plurality of first nanowires 106.

The process of forming the first gate structure 203 may include the following exemplary steps. The first dummy gate structure 103 may be removed to form a first gate opening (not shown) in the dielectric layer 213. The portion of the first sacrificial layer 205 exposed by the first gate opening may be removed to form a first trench (not shown) between adjacent first nanowires 106 and between the substrate and the adjacent first nanowire 106. A first gate structure 203 may be formed in the first gate opening and the first trench. The first gate structure 203 may surround each of the plurality of first nanowires 106.

The first gate structure 203 may include a gate dielectric layer (not labeled), a work function layer (not labeled) located on the gate dielectric layer, and a gate electrode layer (not labeled) located on the work function layer. In other embodiments, the first gate structure may not include the work function layer.

The gate dielectric layer may be made of a high-K dielectric material (a material with a relative dielectric constant greater than 3.9). The high-K dielectric material may include hafnium oxide (HfO$_2$) or aluminum oxide (AlO$_x$). The work function layer may be made of a P-type work function material or an N-type work function material. The P-type work function material may include titanium nitride (TiN$_x$) or tantalum nitride (TaN$_x$). The N-type work function material may include titanium aluminum (TiAl). The gate electrode layer may be made of a material including a metal. The metal may include cupper, tungsten, or a combination thereof.

In some embodiments, the gate dielectric layer may be made of a material including tantalum nitride (TaN$_x$); the work function layer may be made of a material including titanium aluminum (TiAl); and the gate electrode layer may include tungsten.

In other embodiments, a second gate structure may be formed over the second region, of the substrate and the second gate structure may surround each of the plurality of second nanowires.

The process of forming the second gate structure may include the following exemplary steps.

The second dummy gate structure may be removed to form a second gate opening (not shown) in the dielectric layer. The portion of the second sacrificial layer exposed by the second gate opening may be removed to form a second trench (not shown) between adjacent second nanowires and between the substrate and the adjacent second nanowire. A second gate structure may be formed in the second gate opening and the second trench. The second gate structure may surround each of the plurality of second nanowires.

In one embodiment, the second gate structure may include a gate dielectric layer (not labeled), a work function layer (not labeled) located on the gate dielectric layer, and a gate electrode layer (not labeled) located on the work function layer. In other embodiments, the second gate structure may not include the work function layer.

The gate dielectric layer may be made of a high-K dielectric material (a material with a relative dielectric constant greater than 3.9). The high-K dielectric material may include hafnium oxide (HfO$_2$) or aluminum oxide (AlO$_x$). The work function layer may be made of a P-type work function material or an N-type work function material. The P-type work function material may include titanium nitride (TiN$_x$) or tantalum nitride (TaN$_x$). The N-type work function material may include titanium aluminum (TiAl). The gate electrode layer may be made of a material including a metal. The metal may include cupper, tungsten, or a combination thereof.

In one embodiment, the gate dielectric layer may be made of a material including tantalum nitride (TaN$_x$); the work function layer may be made of a material including titanium aluminum (TiAl); and the gate electrode layer may include tungsten.

As such, a semiconductor structure may be formed by the method described above. In the semiconductor structure, the first doped layer 212 formed over the third region III of the substrate 100 may include second doping ions, and the first doped layer 212 may be in contact with the sidewall surface of each first nanowire 106 and the sidewall surface of each second nanowire 108, respectively. The resistance of the first doped layer 212 may be large, such that the resistance of the semiconductor structure may also be large in the on state. As such, the semiconductor structure may be unlikely broken down, which is conducive to the performance of the semiconductor structure. At the same time, the method for forming the semiconductor structure may be able to simplify the fabrication process of the semiconductor structure, and can be integrated with the existing nanowire transistor fabrication process without any need for substantially changing the existing process. Therefore, the stability of the fabrication process may be improved.

Correspondingly, the present disclosure further provides a semiconductor structure. FIG. 7 illustrates a schematic cross-sectional view of an exemplary semiconductor structure consistent with various embodiments of the present disclosure.

Referring to FIG. 7, the semiconductor structure may include a substrate 100. The substrate 100 may include a first region I, a second region II, and a third region III. The third region III may be located between the first region I and the second region II, and may be in contact with each of the first region I and the second region II.

The semiconductor structure may include a first fin structure disposed over the first region I of the substrate 100. The first fin structure may include a plurality of first nanowires 106, each parallel with the surface of the substrate 100. The plurality of first nanowires 106 may be arranged above each other along a direction perpendicular to the surface of the substrate 100. The plurality of first nanowires 106 may contain first doping ions.

The semiconductor structure may include a second fin structure disposed over the second region II of the substrate 100. The second fin structure may include a plurality of second nanowires 108, each parallel with the surface of the substrate 100. The plurality of second nanowires 108 may be arranged above each other along a direction perpendicular to the surface of the substrate 100. The plurality of second nanowires 108 may contain the first doping ions.

The semiconductor structure may include a first doped layer 212 formed over the third region III of the substrate 100. The first doped layer 212 may be in contact with the sidewall surface of each first nanowire 106 and the sidewall surface of each second nanowire 108, respectively. The first doped layer 212 may contain second doping ions. The type of the second doping ions may be opposite to the type of the first doping ions.

The semiconductor structure may also include a source doped layer 209 disposed over the first region I of the substrate 100. The source doped layer 209 may be in contact with the sidewall surface of each first nanowire 106. The source doped layer 209 and the first initial doped layer 210 may be respectively located on the two opposite sides of the plurality of first nanowires 106.

The semiconductor structure may include a drain doped layer 211 disposed over the second region II of the substrate 100. The drain doped region 211 may be in contact with the sidewall surface of each second nanowire 108. The drain doped layer 211 and the first initial doped layer 210 may be respectively located on the two opposite sides of the plurality of second nanowires 108.

The semiconductor structure may further include a first gate structure 203 formed across the first fin structure. The first gate structure 203 may surround each of the plurality of first nanowires 106.

In one embodiment, the second doping ions may include N-type doping ions or P-type doping ions. The N-type doping ions may include phosphorus ions, arsenic ions, or a combination thereof. The P-type doping ions may include boron ions, boron fluoride ions, indium ions, or a combination thereof. In one embodiment, the concentration of the second doping ions may be in a range of approximately 8E18 atom/cm$^3$ to 6E19 atom/cm$^3$.

In one embodiment, the first doped layer 212 may be made of a material including silicon carbide (SiC) or silicon germanium (SiGe).

In one embodiment, the source doped layer 209 and the drain doped layer 211 may contain third doping ions.

In one embodiment, the concentration of the second doping ions may be a first concentration, and the concentration of the third doping ions may be a second concentration. The first concentration may be smaller than the second concentration.

In one embodiment, the semiconductor structure may further include a plurality of first sidewall spacers 112 located on the sidewall surface of the first gate structure 203 between adjacent first nanowires 106 and between the substrate 100 and adjacent first nanowire 106. The sidewall surfaces of the plurality of first sidewall spacers 112 may be vertically aligned with the sidewall surface of the plurality of first nanowires 106.

In one embodiment, the second fin structure may further include a plurality of second sacrificial layers 207 located between adjacent second nanowires 108 and between the substrate 100 and the adjacent second nanowire 108. The semiconductor structure may include a plurality of second sidewall spacers 113 formed on the sidewall surfaces of the plurality of second sacrificial layers 207. The sidewall surfaces of the plurality of second sidewall spacers 113 may be vertically aligned with the sidewall surface of the plurality of second nanowires 108.

In one embodiment, the semiconductor structure may also include a second dummy gate structure 104 disposed over the second region II of the substrate 100. The second dummy gate structure 104 may be formed across the second fin structure.

In other embodiments, the semiconductor structure may not include the plurality of second sacrificial layers, and the semiconductor structure may include a second gate structure disposed over the second region of the substrate. The second gate structure may surround each of the plurality of second nanowires.

In one embodiment, the semiconductor structure may also include a dielectric layer 213 formed on the substrate 100. The first gate structure 203 may be located in the dielectric layer 213.

In the semiconductor structure, the first doped layer 212 formed over the third region III of the substrate 100 may contain second doping ions. The first doped layer 212 may be in contact with the sidewall surface of each first nanowire 106 and the sidewall surface of each second nanowire 108, respectively. The resistance of the first doped layer 212 may be large, such that the resistance of the semiconductor structure may also be large in the on state. As such, the semiconductor structure may be unlikely broken down, which is conducive to the performance of the semiconductor structure.

Compared to existing semiconductor structures and fabrication methods, the disclosed semiconductor structures and fabrication methods may demonstrate the following exemplary advantages.

According to the disclosed semiconductor structure, the first doped layer disposed over the third region of the substrate contains second doping ions, and the first doped layer is in contact with the sidewall surface of each first nanowire and the sidewall surface of each second nanowire, respectively. The resistance of the first doped layer is large, such that the resistance of the semiconductor structure is also large in the on state. As such, the semiconductor structure may be unlikely broken down, which is conducive to the performance of the semiconductor structure.

Further, according to the disclosed fabrication method, a first initial doped layer containing third doping ions is formed over the third region of the substrate, and then fourth doping ions are implanted into the first initial doped layer to form a first doped layer. The type of the fourth doping ions is opposite to the type of the third doping ions. As a result, the first doped layer contains second doping ions, and the type of the second doping ions is opposite to the typed of the first doping ions. Therefore, as compared to the ion concentration in the first initial doped layer, the ion concentration in the first doped layer is reduced. Thus, without increasing the size of the first doped layer, the resistance of the first doped layer increases, thereby increasing the breakdown voltage of the semiconductor structure and improving the performance of the semiconductor structure. At the same time, the disclosed method is able to simplify the fabrication process of the semiconductor structure, and can be integrated with the existing nanowire transistor fabrication process without any need for substantially changing the existing process. Therefore, the stability of the fabrication process may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
a substrate, including a first region, a second region, and a third region located there-between and in contact with each of the first region and the second region;
a first fin structure, formed over the first region of the substrate, the first fin structure including a plurality of first nanowires that are parallel to a surface of the substrate and arranged in a direction perpendicular to the surface of the substrate, wherein each of the plurality of first nanowires contains first doping ions;
a second fin structure, formed over the second region of the substrate, the second fin structure including a plurality of second nanowires that are parallel to the surface of the substrate and arranged in the direction perpendicular to the surface of the substrate, wherein each of the plurality of second nanowires contains the first doping ions;
a first doped layer, disposed over the third region of the substrate and in contact with a sidewall surface of each of the plurality of first nanowires and a surface of each of the plurality of second nanowires, wherein the first doped layer contains second doping ions, and a type of the second doping ions is opposite to a type of the first doping ions;
a source doped layer, disposed over the first region of the substrate and in contact with a sidewall surface of each first nanowire, wherein the source doped layer and the first doped layer are located on two sides of the plurality of first nanowires, respectively;
a drain doped layer, disposed over the second region of the substrate and in contact with a sidewall surface of each second nanowire, wherein the drain doped layer and the first doped layer are located on two sides of the plurality of second nanowires, respectively; and
a first gate structure, disposed across the first fin structure and surrounding each of the plurality of first nanowires;
wherein a thickness of the first doped layer along sidewalls of the first gate structure and the first fin structure is same as a thickness of the source doped layer or the drain doped layer.

2. The semiconductor structure according to claim 1, wherein:
the second doping ions include N-type doping ions or P-type doping ions, wherein:
the N-type doping ions include phosphorus ions, arsenic ions, or a combination thereof; and
the P-type doping ions include boron ions, boron fluoride ions, indium ions, or a combination thereof.

3. The semiconductor structure according to claim 1, wherein:
a concentration of the second doping ions is in a range of approximately 8E18 atom/cm$^3$ to 6E19 atom/cm$^3$.

4. The semiconductor structure according to claim 1, wherein:
the first doped layer is made of a material including silicon phosphide (SiP) or silicon germanium (SiGe).

5. The semiconductor structure according to claim 1, wherein:
the source doped layer and the drain doped layer contain third doping ions.

6. The semiconductor structure according to claim 5, wherein:
a concentration of the second doping ions in the first doped layer is a first concentration; and
a concentration of the third doping ions in the source doped layer and the drain doped layer is a second concentration, wherein:
the first concentration is smaller than the second concentration.

7. The semiconductor structure according to claim 1, further including:
a plurality of first sidewall spacers, located on a sidewall surface of the first gate structure between adjacent first nanowires and between the substrate and an adjacent first nanowire, wherein:
a sidewall surface of each first sidewall spacer is vertically aligned with a sidewall surface of the plurality of first nanowires.

8. The semiconductor structure according to claim 1, wherein the second fin structure further includes:
a plurality of second sacrificial layers located between adjacent second nanowires and between the substrate and an adjacent second nanowire; and
a plurality of second sidewall spacers, located on a sidewall surface of the plurality of second sacrificial layers, wherein:
a sidewall surface of each second sidewall spacer is vertically aligned with a sidewall surface of the plurality of second nanowires.

9. The semiconductor structure according to claim 1, further including:
a second dummy gate structure, disposed over the second region of the substrate and across the second fin structure.

10. The semiconductor structure according to claim 1, further including:
a dielectric layer, disposed on the substrate, wherein the first gate structure is located in the dielectric layer.

11. The semiconductor structure of claim 1, further comprising:
a second gate structure, disposed over the second region of the substrate and across the second fin structure, wherein the second gate structure surrounds each of the plurality of second nanowires;
wherein the first gate structure and the second structure are disposed between the source doped layer and the drain doped layer, and the first doped layer is disposed between the first gate structure and the second gate structure.

12. The semiconductor structure of claim 1, wherein:
the first doped layer and the plurality of second nanowires together form a drift region of the semiconductor structure, a breakdown voltage of the semiconductor structure being determined based on a length of the drift region.

13. A method for forming a semiconductor structure, comprising:
providing a substrate, including a first region, a second region, and a third region located there-between and in contact with each of the first region and the second region;
forming a first initial fin structure over the first region of the substrate, the first fin structure including a plurality of first nanowires that are parallel to a surface of the substrate and arranged in a direction perpendicular to the surface of the substrate, wherein each of the plurality of first nanowires contains first doping ions;
forming a second initial fin structure over the second region of the substrate, the second fin structure including a plurality of second nanowires that are parallel to the surface of the substrate and arranged in the direction perpendicular to the surface of the substrate, wherein each of the plurality of second nanowires contains the first doping ions;

forming a first initial doped layer over the third region of the substrate and in contact with a sidewall surface of each of the plurality of first nanowires and a surface of each of the plurality of second nanowires, wherein the first initial doped layer contains third doping ions, and a type of the third doping ions is opposite to a type of the first doping ions;

forming a source doped layer over the first region of the substrate and in contact with a sidewall surface of each first nanowire, wherein the source doped layer and the first doped layer are located on two sides of the plurality of first nanowires, respectively;

forming a drain doped layer over the second region of the substrate and in contact with a sidewall surface of each second nanowire, wherein the drain doped layer and the first doped layer are located on two sides of the plurality of second nanowires, respectively;

implanting fourth doping ions into the first initial doped layer to form a first doped layer, wherein a type of the fourth doping ions is opposite to the type of the third doping ions, the first doped layer contains second doping ions, and a type of the second doping ions is opposite to the type of the first doping ions; and forming a first gate structure over the first region of the substrate and across the first fin structure, wherein the first gate structure surrounds each of the plurality of first nanowires;

wherein a thickness of the first doped layer along sidewalls of the first gate structure and the first fin structure is same as a thickness of the source doped layer or the drain doped layer.

14. The method according to claim 13, wherein:
a concentration of the second doping ions in the first doped layer is a first concentration; and;
a concentration of the third doping ions in the source doped layer and the drain doped layer is a second concentration, wherein:
the first concentration is smaller than the second concentration.

15. The method according to claim 13, wherein:
implanting the fourth doping ions into the first initial doped layer includes an ion implantation process.

16. The method according to claim 13, wherein:
the first initial fin structure further includes a plurality of first sacrificial layers, located between adjacent first nanowires and between the substrate and an adjacent first nanowire; and
the second initial fin structure further includes a plurality of second sacrificial layers, located between adjacent second nanowires and between the substrate and an adjacent second nanowire.

17. The method according to claim 16, prior to forming the first initial doped layer, further including:
forming a first dummy gate structure over the first region of the substrate and across the first initial fin structure; and
forming a second dummy gate structure over the second region of the substrate and across the second initial fin structure.

18. The method according to claim 17, after forming the first dummy gate structure and the second dummy gate structure and prior to forming the first initial doped layer, further including:
forming a plurality of first sidewall spacers on a sidewall surface of the plurality of first sacrificial layers between adjacent first nanowires and between the substrate and an adjacent first nanowire, wherein a sidewall surface of each first sidewall spacer is vertically aligned with a sidewall surface of the plurality of first nanowires; and
forming a plurality of second sidewall spacers on a sidewall surface of the plurality of second sacrificial layers between adjacent second nanowires and between the substrate and an adjacent second nanowire, wherein a sidewall surface of each second sidewall spacer is vertically aligned with a sidewall surface of the plurality of second nanowires.

19. The method according to claim 17, wherein forming the first gate structure includes:
forming a dielectric layer on the substrate, wherein the first dummy gate structure is located in the dielectric layer;
removing the first dummy gate structure to form a first gate opening;
removing the plurality of first sacrificial layers exposed by the first gate opening to form a first trench between adjacent first nanowires and between the substrate and a first nanowire; and
forming a first gate structure in the first gate opening and the first trench, wherein the first gate structure surrounds each of the plurality of first nanowires.

20. The method according to claim 19, wherein the second dummy gate structure is located in the dielectric layer, and the method further includes:
removing the second dummy gate structure to form a second gate opening;
removing the plurality of second sacrificial layers exposed by the second gate opening to form a second trench between adjacent second nanowires and between the substrate and a second nanowire; and
forming a second gate structure in the second gate opening and the second trench, wherein the second gate structure surrounds each of the plurality of second nanowires.

* * * * *